United States Patent [19]

Fan et al.

[11] Patent Number: 5,620,524

[45] Date of Patent: Apr. 15, 1997

[54] APPARATUS FOR FLUID DELIVERY IN CHEMICAL VAPOR DEPOSITION SYSTEMS

[76] Inventors: Chiko Fan, 810 El Quanito Dr., Danville, Calif. 94526; Anthony Pearson, 498 Los Pinos Way, San Jose, Calif. 95123; J. James Chen, 2304 Maximilian Dr., Campbell, Calif. 95008; James L. White, Jr., 392 Eagle Trace, Half Moon Bay, Calif. 94109

[21] Appl. No.: 395,613

[22] Filed: Feb. 27, 1995

[51] Int. Cl.$^6$ .................................................. C23C 16/00
[52] U.S. Cl. ...................... 118/726; 118/715; 417/415
[58] Field of Search .................................. 417/3, 4, 5, 18, 417/20, 22, 45, 326, 415, 540; 92/86, 87; 118/715, 726

[56] References Cited

U.S. PATENT DOCUMENTS

| | | | |
|---|---|---|---|
| 3,223,040 | 12/1965 | Dinkelkamp | 417/3 |
| 3,818,805 | 6/1974 | Johansson | 92/87 |
| 3,818,807 | 6/1974 | Semple | 92/87 |
| 3,869,963 | 3/1975 | Schindel | 92/86 |
| 3,943,717 | 3/1976 | Schexnayder | 60/453 |
| 3,985,019 | 10/1976 | Boehme | 73/61.1 C |
| 3,985,021 | 10/1976 | Achener | 73/61.1 C |
| 4,045,343 | 8/1977 | Achener | 210/101 |
| 4,234,427 | 11/1980 | Boehme | 210/198 C |
| 4,321,014 | 3/1982 | Eburn | 417/5 |
| 4,352,636 | 10/1982 | Patterson | 417/22 |
| 4,556,367 | 12/1985 | Schmid | 417/18 |
| 4,600,365 | 7/1986 | Riggenmann | 417/246 |
| 4,714,545 | 12/1987 | Bente | 210/101 |
| 4,808,092 | 2/1989 | Funke | 417/454 |
| 4,911,405 | 3/1990 | Weissgerber | 251/129.14 |
| 4,947,889 | 8/1990 | Ishikawa | 137/486 |
| 5,078,922 | 1/1992 | Collins | 261/139 |
| 5,098,741 | 3/1992 | Nolet | 427/248.1 |
| 5,129,418 | 7/1992 | Shimomura | 137/486 |
| 5,160,542 | 11/1992 | Mihira | 118/715 |
| 5,201,851 | 4/1993 | Holmstrom | 417/415 |
| 5,204,314 | 4/1993 | Kirlin | 505/1 |
| 5,243,821 | 9/1993 | Schuck | 62/50.6 |
| 5,253,981 | 10/1993 | Yang | 417/3 |
| 5,259,731 | 11/1993 | Dhindsa | 417/3 |
| 5,440,887 | 8/1995 | Nishizato | 62/50.7 |
| 5,450,743 | 9/1995 | Buote | 73/61.56 |
| 5,470,390 | 11/1995 | Nishikawa | 118/719 |
| 5,534,069 | 6/1996 | Kuwabara | 118/719 |

*Primary Examiner*—R. Bruce Breneman
*Assistant Examiner*—Jeffrie R. Lund

[57] ABSTRACT

Described herein is an apparatus and method for delivering fluid components for semiconductor processes such as chemical vapor deposition (CVD) and chemical etch processes. Any prescribed mixture of separate fluid reagents can be delivered with extreme accuracy and precision using the apparatus we describe here. The unique embodiment of a precision fluid pumping system utilizing internal pressure and temperature transducers, capacity volume and restrictive elements that comprise a continuous pulse-free system for use in CVD applications. This system has superior performance characteristics in the areas of: accuracy, precision, repeatability of the fluid mixture delivery and continuous repeatable delivery without intermittent pulsation. We describe a novel fluid pump whose design is integrated using a closed loop feedback system composed of temperature and pressure sensors. This allows the entire system to perform to in either an isobaric-isothermal mode or an isocratic-isothermal mode. The construction of this system is separated into three principle areas (Fluid Pump Hardware), (Fluid phase change hardware) and (Control algorithms), the complete embodiment constitutes a novel invention in the field of chemical delivery as pertaining to the fabrication of semiconductor devices.

6 Claims, 5 Drawing Sheets

FIG_2

FIG_3-A

FIG_3-B

FIG_4

APPARATUS FOR FLUID DELIVERY IN CHEMICAL VAPOR DEPOSITION SYSTEMS

BACKGROUND OF THE INVENTION

This invention relates to the metering of fluid reagents and their mixtures utilized in semiconductor processes, most notably CVD and etch processes. The apparatus described is a complete system for the delivery of said reagents comprised of a high performance plunger positive displacement pump and its associated electronics and a simple design that allows for the vaporization of metered reagents into the gas phase.

BACKGROUND DESCRIPTION OF THE PRIOR ART

The invention and the present state of the art concerning fluid delivery systems, (where we define a fluid as being either a liquid or gas component, and we do not preclude the fluid from being in a supercritical state) involves the following physical methods:

Vaporization systems which are termed "bubblers" in the vernacular are physically based upon creating a phase change from the liquid to the gaseous state. These methods operate by controlling the vapor pressure of a liquid chemical reagent using temperature in conjunction with a flow of carrier gas that is directed through the liquid and which then becomes saturated with the liquid reagent vapor at a known temperature. This type of method is exemplified by U.S. Pat. Nos. 5,243,821, 5,160,542 and 5,078,922.

A passive form of vaporization technology similar to "bubblers", that must rely on an active delivery system can be described as a passive vaporizer. Typically these vaporizer systems are termed "Flash Vaporizers", "Ultrasonic vaporizers", "Wicking type vaporizers". These methods rely upon the actual delivery of said reagents into the apparatus whereby the conversion of the fluid to the gas phase takes place via energy transfer into the fluid. One of these methods is exemplified by U.S. Pat. No. 5,204,314.

Passive delivery systems that are based upon metering technologies such as gas mass-flow controllers, liquid mass flow controllers, and simple metering techniques such as pressure regulation and or simple metering valves. Two of these mass-flow devices are exemplified by U.S. Pat. Nos. 5,129,418, and 4,947,889. The technology of liquid and gas mass flow devices are always based upon the metered fluid exchanging energy either with a cooled or heated structure within the device. The measurement of the energy is proportional to the mass flow of the fluid in contact with the structure.

Active delivery systems that are characterized by the use of fluid metering pumps. These pumps generally fall into a diaphragm or positive displacement or rotary type of design. Several state-of-the art positive displacement pumps used for HPLC solvent delivery are exemplified by U.S. Pat. Nos. 4,714,545, 5,253,981 and 4,556,367. These pumping delivery systems have not been claimed for semiconductor reagent delivery and are inadequate for several different reasons.

The disadvantages of bubbler systems are numerous in comparison to positive displacement or metered systems. One major disadvantage is that the actual mass flow component of process reagents being delivered to the process chamber is completely dependent on the temperature of the vessel that contains the reagent, and the vapor pressure-temperature curve of the reagent being delivered. Although these vapor pressure curves versus temperature can be described very accurately through either theoretical or experimental methods, the ability to control the temperatures of the reagents to a high degree is very difficult. For many reagents this translates to an unacceptable degree of uncertainty in determining the concentration of reagent in the saturated vapor phase leaving the bubbler apparatus.

Another major disadvantage of said bubbler devices concerns their inability to deliver component mixtures. Since the delivery of said mixtures is always dependent completely on the enthalpy of vaporization of the reagent components, there exists no way to adjust the saturated vapor phase concentration for any mixture of different reagent components within a bubbler. This leads to having to use separate bubbler apparatus for each component that composes the mixture.

The fact that the saturated vapor phase concentration of any particular reagent component leaving the bubbler and heading for the reaction vessel is dependent solely upon the temperature within the bubbler leads to another strong disadvantage that involves reagent dimerization and trimerization etc. Many reagents can readily form dimers and trimers within the liquid phase, and the enthalpy of vaporization of these polymers is a function of their molecular weight. The result of such behavior is that the reagent's monomer concentration is most strongly depleted over time versus the dimer or trimer concentrations. This leads to a variability over time in the saturated vapor phase concentration of total monomer unless fresh monomer is added to the system to restore the equilibrium concentration. This is one particular reason as to why it is necessary to use a refill pump to refill the bubbler vessel to a predetermined level, even though the bubbler vessel is far from being exhausted of its reagent.

Thermal vaporizers rely solely upon thermal energy to vaporize metered reagents into the gas phase. These said devices suffer from the problem that the time over which the vaporization occurs cannot be controlled. Typically these devices consist of a controlled heated chamber, that has liquid reagent delivered to it by an outside source. Since the actual rate of liquid delivery to these chambers is quite small for semiconductor processes the drops of fluid entering the chamber vaporize instantaneously. This can create a pulsing effect of gas into the semiconductor reaction vessel as well as producing an instantaneous back pressure on the nozzle delivering fluid into the vaporization vessel. This back pressure can lead to an uneven size for the droplet formation at the liquid nozzle tip. Conversely since the rate of vaporization of the liquid drops is dependent upon their size, any size distribution that occurs due in the delivery apparatus itself will manifest itself as a fluctuation in time of the reagent gas phase concentration in the reaction vessel of the semiconductor process.

Kinetic or ultrasonic vaporization devices most typically utilize a gas jet or gas flow to transtar energy into the reagent fluid. The normal rule for such systems is to spread the liquid reagent over as large a surface area as possible, such as a stainless steel mesh of very fine dimensions. This mesh or "wick" can be heated if needed, and a flow of buffer gas used in the semiconductor process can be flowed through or around this mesh. The vaporization rate from these type of structures is highly dependent on the velocity of the buffer gas stream crossing the structures, which depends on a constant pressure supply for the buffer gas. This is a major disadvantage unless the pressure can be controlled precisely and unless foreign matter is completely excluded from entering the vaporization mesh.

Most kinetic vaporization devices resemble a carburetor design and act via the atomization of the reagent liquid into the gas stream via kinetic energy transfer from the gas to the liquid. Once the liquids are atomized they can quickly vaporize if sufficient thermal energy is available. These type of systems are severely degraded when the pressure across their outlet nozzles is not held constant or high enough to cause a smooth atomization of the reagent into the buffer gas stream. The other problem that kinetic jet nozzles have is the matching of the gas flow across the nozzle to that of the actual liquid flow being delivered through the nozzle by the active delivery system. If the flow across the nozzle is too high then liquid can be drawn from the tip before the active delivery system can replenish it. Likewise if the flow across the nozzle tip is not high enough the active delivery system continues to deliver reagent to the system whether it is vaporized or not.

The ultrasonic systems use sound energy to create atomization or are used in combination with kinetic gas jets. They can suffer from the same problems as the non ultrasonic vaporization systems.

The general principles by which gas mass flow controllers operate depends completely upon the thermodynamic properties of the gas entering the system. Most notably the properties of thermal conductivity and heat capacity of the reagent gas need to be known in order to properly determine an accurate mass flow passing through said devices. The disadvantages of these devices is well known but most notably associated with the following:

a) The dynamic range control capability of the flow limiting valves of said devices is typically controllable to within about one percent of the total maximum flow allowed from the devices.

b) Since most of these devices rely upon a small internal heater to produce heat for the measurement of the mass flow within a small capillary in the device, the reliability over time that the heater will continue to produce the same thermal output from month to month or year to year is very low. This accounts for the reason why gas mass flow devices typically undergo calibration procedure on a frequent schedule.

c) The small capillary tubes in these devices are subject to plugging and the seals in the device can wear leading to corrosive oxidation reactions within the device for gases such as chlorine, hydrofluoric acid etc.

d) The determination of accurate mass flows for exotic gases whose thermodynamic properties are not well known must be accomplished via some type of secondary calibration.

e) The mass flow exiting the controllers is dependent upon the external pressure at both the entrance and exits of the device.

Liquid mass flow controllers depend upon energy transfer principles as well, but in the case of liquids it is not possible to use a heated sensing structure due to several deleterious effects that can occur, primarily that of gas formation within the liquid. This is pointed out in U.S. Pat. No. 4,947,889. The state of the art in liquid mass flow controllers relies instead on electronically cooling a small conduit or passageway through which the liquid can flow. The change in the liquid's temperature will be downward and proportional to the mass flow moving through the conduit. This change in temperature can be measured and used to calculate the mass flow of liquid through the conduit.

These devices still depend on the knowledge of the thermodynamic properties of the reagent liquid as well as being dependent on precise temperature measurements of the liquid in the conduit. Since the temperature measurement must be made in a non contacting manner, the thermal conductivity and heat capacity of the conduit play a large role in determining the accuracy of the device. The dynamic control range of said devices can be large, but the precision control of the valve stems is poor, especially for very low flows where valve stem is near it seated position. This problem is further exacerbated by the fact that the viscosity of many reagents can be a strong function of temperature. When said device operates in a very low flow regime, the reagent can experience a significant degree of cooling and associated viscosity change that can create many uncertainties regarding the delivery of the reagent.

Positive displacement pumps have been designed with single chamber cam driven designs, or with dual chamber, dual cam driven designs. Pump designs based upon a single chamber and single piston must always initiate a rapid refilling cycle after their delivery phase has completed in order to minimize any discontinuities in the delivery rate over time. Although these pumps generally refill very rapidly on the order of hundreds of milliseconds, the sudden drop in pressure due to the refill phase will be registered as a negative pulse in the flow versus time domain. There are at least two general problems associated with these rapid refill cycles performed by the single chamber cam driven or the single chamber screw driven plunger designs.

The first problem is that upon initiating a rapid refill, the plunger will be drawn back at a high velocity causing a higher degree of seal wear on the primary seal. After any wear on this seal occurs leakage of the reagent past the seal is inevitable, and this design provides no means of isolating this leak from the outside environment. A reagent such as TEOS (tetraethoxysilane), or (tetraethyl-orthosilicate) will crystallize upon exposure to oxygen or moisture, and the primary formation of crystals will occur at the outer plunger seal interface. This further aggravates the situation until the seal can no longer form an adequate barrier to the environment and crystallization can begin occurring on the inner surfaces of where the seal and plunger join.

The second problem with the single chamber design is that the continuity of the fluid delivery is very poor when the pump is operating in a continuous delivery mode as previously discussed. During the chamber's refill phase, the flow from the system is momentarily stopped and loss of pressure occurs in the system. This loss of pressure is generally compensated for by having the system perform an initial compression stroke of the fluid the system. This compression stroke causes another momentary non-equilibrium condition of the pressure in the system that can also appear as a pressure pulse.

The cam driven positive displacement design has been used for the delivery of semiconductor reagents in either single or dual chamber designs. Theses cam driven designs have inherent problems related to the cam surface. One such problem is related to the ration of the stroke and refill phase. Cam driven systems that have practical delivery stroke to refill cycle ratios with flow delivery rates less than 50 µl per minute are costly and difficult to construct. The precision of the volumetric flow from a cam driven system is also problematic. Since the shape of the cam surface and the ability to control the motion of the surface determine the accuracy and precision of the delivery rate, the cam surface itself must be machined precisely in order to guarantee a precise delivery. At present the precision of such systems is typically 1 percent of the nominal flow rate. The resolution of these type of systems is also not very good and on the order of 0.1 percent of the nominal flow rate.

BRIEF SUMMARY OF THE INVENTION

The object of this invention is to provide a complete system for the delivery of chemical reagents into semiconductor processing equipment that is characterized by processes such as:

APCVD, MOCVD, LPCVD, PECVD, Plasma Etch, and Wet-Etch processes for the production of various thin-films associated with the manufacture of semiconductor devices. The system is characterized by a positive displacement fluid delivery pump for the precision dispensing of fluids defined to mean liquid reagents or liquefied gaseous reagents or high pressure gases. The outlet head of the system connects is connected in series to a fluid reservoir through a restrictive capillary which then exits to a restrictive element connected in series to a vaporizing module. The pump is ideally embodied as a dual motor, dual chamber ball screw design similar to U.S. Pat. Nos. 4,714,545 and 5,253,981, although it may also be ideally embodied as a single chamber design for discrete processes. The system can be assembled to operate in either of two distinct modes designated as a "continuous gradient mode" or as a "step gradient mode". The "continuous gradient mode" is used to provide multi-reagent dispensing of mixtures in applications that require precise and accurate molar concentrations, or when a very small quantity of one reagent with respect to another in the mixture is needed. This mode of operation is characterized by the parallel combination of one dual motor, dual-chamber pump for every specific reagent used in the mixture. The output of these pumps then lead to independently heated or cooled compliant liquid reservoirs that are maintained at high pressure due to their highly restrictive outlets. The outlets from these reservoirs deliver the heated or cooled reagents to a temperature controlled gas mixing block. The continuous gradient mode can thus provide independent control of the mass flow of each reagent and combines the metered outputs in the gas mixing block. This mode ensures that the most precise and accurate mixtures are created.

The step gradient mode is characterized by only a single dual chamber pumping unit, where the primary chamber is connected to a common manifold connected to four independently switched solenoid valves. These switching valves are then responsible for forming the quantities in the mixture by switching between the reagent reservoirs. This allows the formation of a controlled mixture within the primary chamber during its filling cycle that is proportioned according to a programmed algorithm. The preferred embodiment is a configuration that allows for three separate reagent sources and a single buffer gas supply that can be used for purging the system Other designs for similar positive fluid displacement pumps in the category of Liquid Chromatography technology U.S. Pat. Nos. 4,714545, 5,253,981 cannot meet the needs required in semiconductor processing. We have examined the needs of these processes and have developed a complete system that can precisely deliver fluid flows in the range of 1 µl/min up to 5 ml/min with a maximum standard deviation of 0.1% of the nominal delivery rate and resolution step of 0.01 µl/min. The delivery is done in a continuous pulse-free manner to a high pressure compliant reservoir that then heats or cools the liquid reagent to a desired temperature. The high pressure heated reagent remains in the liquid state until it exits into the gas mixing block that is held at a significantly lower pressure than the compliant reservoir. As the superheated reagent exits into the gas mixing block it is instantaneously converted to a gas phase product which is then coupled to the reactor chamber of the semiconductor process being performed. The high accuracy, precision and resolution is provided by the utilization of a ball screw design implemented with a commercially available motion control processor and optical stepping motor encoder. The pulse-free continuous delivery of this pump is obtained by using a unique combination of delivery hardware and plumbing. The inventions described by U.S. Pat. Nos. 4,714, 545, 5,253,981 suggest that they deliver pulse-free operation but our experience is that they still require large pulse dampers in order to achieve a result that might be considered pulse-free. Our design does not require the use of a pulse damper to achieve pulse-free results, and our laboratory results show no measurable change in system pressure or delivery rate during any part of the delivery or refill cycles.

Since many chemical reagents used in semiconductor manufacture are very sensitive when exposed to water or oxygen, it was necessary to design a pumping chamber that would provide against the exposure of these elements to any reagent that might happen to pass through the primary seal of the pumping chamber. This lead us to construct a "washing chamber" directly behind the primary seal of each pumping chamber. The plunger passes through another seal which we term our secondary seal on the non-mated side of the washing chamber. The washing chamber has inlet and outlet ports that conduct a process compatible solvent into and out of the washing chamber. This compatible solvent then acts by solrating the primary CVD chemical reagent. In this fashion any leaking reagent can be solvated and removed through the outlet port of said washing chamber which always has a positive flow of fluid passing through it. The other mechanism by which said washing chamber acts is by preventing the diffusion of oxygen or moisture through the primary seal and into the pumping chamber. The solvent contained in said washing chamber also acts as a physical diffusion barrier to any gases or other foreign particles. The public domain art of preventing crystallization of solids in High Performance Liquid Chromatography (HPLC) pumps is well known and these devices can be found on almost all commercially available HPLC pumping systems.

The delivery system is constructed using a dual plunger, dual independent bi-directional motor design. This allows for the system to have fully independently programmable dispensing and refilling cycles of the primary and secondary fluid chambers. The dual fluid chamber design and the independent control of the refill and delivery cycles allows many advantages that include:

a) Lower seal wear and degradation of the plunger seals due to the filling of a secondary delivery chamber during the primary chamber's delivery cycle.

b) Pulse-free operation due to our closed loop pressure control and RCR coupling scheme.

c) Precise and reproducible delivery rates based upon the ability to precisely control the translation rate of each individual ball screw using the monitoring of the pressure within the fluid chambers and the velocities of the motor shafts.

d) The dispensing profile over time of either fluid chamber can be controlled to provide time gradient operation.

e) Our design operating in a step gradient mode utilizes a common manifold connected to four independently switched inlets. The programmed switching of these inlets allows reasonably precise known chemical compositions to be created in the primary pumping chamber. This is essential for such CVD processes as BPSG oxide films that rely on precise relative concentrations of Boron and Phosphorous reagents in combination with a primary Silicon reagent such as TEOS.

The operation of the system in its continuous gradient mode can provide the same capabilities as well as additional capabilities not possible with the step gradient mode of operation. In the continuous gradient mode of operation, the movement of each ball screw is done independently using a servo motor with an optical encoder and "Motion-Control Microprocessor" that all form a closed loop feedback system. This electronic control configuration provides the ability of controlling the plunger movement within the fluid chamber to within microns of movement for any single control pulse relayed to the motor. This type of electronic control gives the system a very high resolution capability for delivering constant composition mixtures in this mode of operation. The mixture resolution capability in the continuous gradient mode is at least one magnitude greater than what is possible when operating the system in its step gradient mode.

Another object of said invention is to combine the knowledge of the temperature and pressure of the fluid within the delivery chamber and utilize it in controlling different aspects of the fluid delivery. The knowledge of the temperature and pressure within the delivery chamber is utilized to compute the density of the fluid in the system. Once the density is known and fixed the actual mass flow of the fluid from the delivery chamber can be accurately calculated from the knowledge of the velocity of the plunger within the delivery chamber which is given by the encoder signal on the motor shaft.

BRIEF DESCRIPTION OF THE DRAWINGS

In the drawings, closely related figures have the same number but different alphabetic suffixes.

FIG. 1 Block diagram of the entire CVD fluid delivery system as configured for the step gradient mode of operation. All external components and some internal components of the system are visible. Most prominently visible are the primary and secondary fluid chambers, drive motors, ball screws and all of the system's associated control hardware shown as host computer and controller board. Also depicted are all of the peripheral valves and modules including: solenoid switching valves, reagent containers, flow through pressure transducer, capacity fluid reservoir, particle filter, shut-off valve, delivery restrictor, and heated gas mixing block. The diagram explicitly depicts the attachment of fluid reagents to the system using four independently switched solenoid valves connected to a common manifold.

DESCRIPTION AND OPERATION OF THE PREFERRED EMBODIMENTS

Description and Advantages of Restrictive-Capacity Coupling or RCR-Coupling:

As suggested earlier we believe that our laboratory data shows that we have designed a continuous delivery, pulse-free micro metering pump that can deliver very accurate and reproducible fluid flows anywhere in the range of 1 μl/min to 40 ml/min. The ability to deliver a continuous flow in a pulse-free manner depends to a large degree on the capacity and restrictive connections of the pump to its external environment, as well as the electronic control circuitry and control algorithms used to control the motion of the displacement elements of the pump. These fundamental elements must all be matched in a manner so that the time constants are logical to with respect to each other.

The theory behind what we call RCR-coupling can be understood by examining a direct electrical circuit analogy and then properly translating it to the case of our fluid delivery system A typical RC low-pass filter has the configuration shown below:

Electrical Low-Pass Filter

The analogy of the components of the electrical low pass filter in terms of hardware components for a fluid delivery system are made in the following manner. A small diameter capillary tube is attached to the output of the secondary pump head which serves as the initial restrictive element or input resistance. At present we use a 50 micron inner diameter tube joined to the delivery line exiting the secondary pump head as this restrictive element. This 50 micron internal diameter tube is then joined in series to a capacity fluid reservoir that has a percentage of volume change with respect to change in the fluid pressure. The heating or cooling of this volume element is accomplished by using a common external heater or cooler and a temperature sensor that allows for their control by an external circuit. This volume element is under nearly the same pressure as the fluid in the liquid chambers of the pump, which allows it to be heated to temperatures greater than the vaporization temperature with respect to its exiting environment. The pressure in the system and the compliance of this volume reservoir determine the capacity of the element for the system. The final element is the load that must be driven with the pump and is supplied by typically a 5–250 micron capillary tube of variable length. This arrangement does provides true pulse-free operation for the system and possibly other similar systems such as those described by said patents. Other systems have similar elements in their design but they are not arranged in the fashion we describe here and as such they can not emulate the electrical low-pass filter shown.

Fluid Phase Change Hardware Description and Advantages:

We now describe a simple method for producing a phase change at low temperature, and pressure that can be characterized as a passive vaporizer in the same category as previously described passive vaporizing devices. The fundamental theory and design of this apparatus is based upon the basic laws of thermodynamics. The compliant reservoir as previously described is not only used as a capacity element to control pressure pulsation in the system, but is also utilized to provide a controlled volume that can be heated or cooled to a desired temperature. Since this reservoir is designed to be large with respect to all of the other volumes in the system, it provides a chance for the reagent to reach an equilibrium temperature condition due to the reagent's long residence time within the volume. The pressure within this reservoir is determined by the flow rate of the reagent exiting the pump head and the diameter of the inlet and outlet tubes to the reservoir. Since the system is designed to be operated at very high pressures with respect to atmosphere on the order of 100–500 atmospheres, the fluid reagent may be heated to very high temperatures with respect to standard conditions. This allows for a superheating of the fluid within the reservoir and the storage of this energy in the liquid phase. Since the fluid will not vaporize under such high pressure conditions unless heated to extremely high temperatures, it is possible for the fluid to carry a large amount of energy that can then be released when the fluid exits into a lower pressure environment where the heat of vaporization is lower. The energy introduced into the fluid in the reservoir then serves to provide the enthalpy of vaporization for the reagent as it exits to a lower pressure gaseous environment.

We propose a passive vaporizer designed to exploit these relationships in a fashion that controls the phase change and or temperature of the liquid entering and exiting the system. Since the phase change of liquid reagents into their gaseous state is crucial to all common CVD and etch processes, the ability to accomplish this in a manner that does not disturb the actual chemical bonds in the material is very important. Through the knowledge of the system pressure, chemical disassociation temperature, enthalpy of vaporization, vaporization temperature, exit pressure, and heat capacity of said liquid reagents it is possible to select and control the temperature of the reagent within the volume reservoir to a value that is ideal for most processes. The basic design is based upon a heated or cooled volume element as described, that is connected in series at its inlet side to the high pressure environment of the pumping chambers and at its exit side to a restrictive capillary tubing.

Building the passive delivery components of this system for CVD applications involves several important considerations:

The residence time of the fluid within the volume reservoir is controlled by choosing the volume of the reservoir appropriately with respect to the nominal flow rate through the system. This residence time is typically chosen to be larger than the residence time associated with any of the other passive elements in the system.

The restrictive capillary components of the system need to be chosen so that nominal working pressures can be established in the system so the RCR scheme can operate. These capillary components also need to be chosen from materials that are compatible with the process reagents being dispensed at the temperature from which they exit the volume element. These capillary tubes are available in a variety of materials such as: Fused Silica, Stainless-Steel, Sapphire, Teflon, Titanium etc.

The temperature of the liquid reagent in the volume element needs to be controlled in a predictable fashion. Common control methods are entirely suitable for maintaining the temperature of the capacity volume element using a common thermistor or RTD device as a temperature sensor.

Although said reagents exist at superheated temperatures in the liquid state within the capacity volume element, the liquid is prevented from vaporizing until it is very near exiting the system, due to the high pressure conditions maintained within the capillary exit tube. We customarily maintain the exit of the system into a preheated or cooled gas mixing block that allows either other reagent process gases or buffer gases to mix with the metered reagents from our system.

Discrete Processes:

Any single substrate CVD process can be characterized as a discrete process, because once the film of interest has been deposited onto the substrate the deposition process must be halted and the deposited substrate removed so that the entire process can be repeated with a new substrate. The amount of time taken to remove the deposited substrate and place a new fresh substrate and restart the process is typically around 10–40 seconds. We now describe our invention in an embodiment that can take advantage of this dead time to perform a refill of a single fluid chamber.

The idealized design of our invention for said discrete processes involves constructing our device using only a single fluid chamber. The preferred embodiment for batch processes has already been described as a design utilizing dual plungers, and dual liquid chambers driven with dual independent motors. Thus the embodiment in the discrete process design will be far simpler and less expensive. The size of the fluid chamber is constructed so as to contain a volume of reagent that is only slightly larger than the desired volume of reagent to be delivered to any individual substrate. This design then allows the reagent delivery process to be continuous for any individual substrate. The refill of the fluid delivery chamber can take place during the substrate removal and placement time associated with the reactor's handling of said substrates. The mechanics and information flow between the fluid delivery system and the substrate handling equipment and other reactor related equipment can be described as follows: a) The fluid delivery system opens its shutoff valve located in front of the capacity reservoir and controls a bypass valve leading to the reaction chamber, and then comes to an equilibrium pressure and flow rate. b) A signal is sent from the controller board to the reactor hardware to begin the deposition process and a new substrate is placed into the reactor. c) Once the chamber is ready to start processing, said bypass valve is adjusted so that either the single reagent or reagent mixture being delivered from the single fluid chamber of said delivery system is diverted to the reaction chamber. d) A prescribed amount of reagent is dispensed to the reactor vessel, after which time said bypass valve is closed and the fluid chamber can then begin its refill cycle. At this time a signal is also sent to the CVD reactor's control hardware to end its deposition process and remove the deposited substrate. e) A new substrate is placed in the chamber and the entire sequence of steps is repeated.

Said mode of operation is always done at constant volume because it is most important to always deliver a precisely repeatable, predetermined quantity of reagent to each substrate. The position of the ball screw mechanism can be readily determined using the optically encoded motor shaft velocity and this allows for a known reagent volume to be delivered. Since this mode of operation is purely discrete it requires only a single fluid chamber, motor and plunger, thus substantially reducing the cost of the delivery system compared to the embodiment described for continuous operation.

Batch Processes:

The implementation of our invention for continuous processes such as moving belt systems or batch reactors, must utilize the dual chamber, dual plunger design already discussed. The method by which to control the flow of reagent from this configuration is discussed below:

Step-1:

The fluid delivery begins from the primary chamber operating in a constant volume mode where the plunger position is known, and the velocity is fixed. At this same time the secondary plunger position is known and static. The pressure in the delivery chamber is determined near the end of the primary delivery phase and saved as a value $P_0$.

Step-2:

When the primary plunger has finished its delivery phase the secondary plunger initiates its delivery phase by moving at a velocity such that the output pressure becomes established at the nominal pressure $P_0$. The primary chamber now refills itself from the reagent bottle at any user preprogrammed rate that is consistent with the needs of the process.

Step-3:

After the primary chamber has refilled, the secondary plunger reverses its travel direction and begins to refill with its fluid supply now being delivered from the primary chamber. The primary chamber delivers fluid at the constant pressure $P_0$ until the secondary chamber has been refilled to a predetermined point. By maintaining the system at the pressure $P_0$ as described in step-1 the constant flow that was established from step-1 can be maintained from the system outlet which goes to the CVD process.

Step-4:

The secondary chamber finishes its refill phase as described by step-3 and sits idle, at which point the primary plunger can now begin to operate in its constant volume mode as it did in step-1. The process has now completed a full-cycle.

Figure 1:
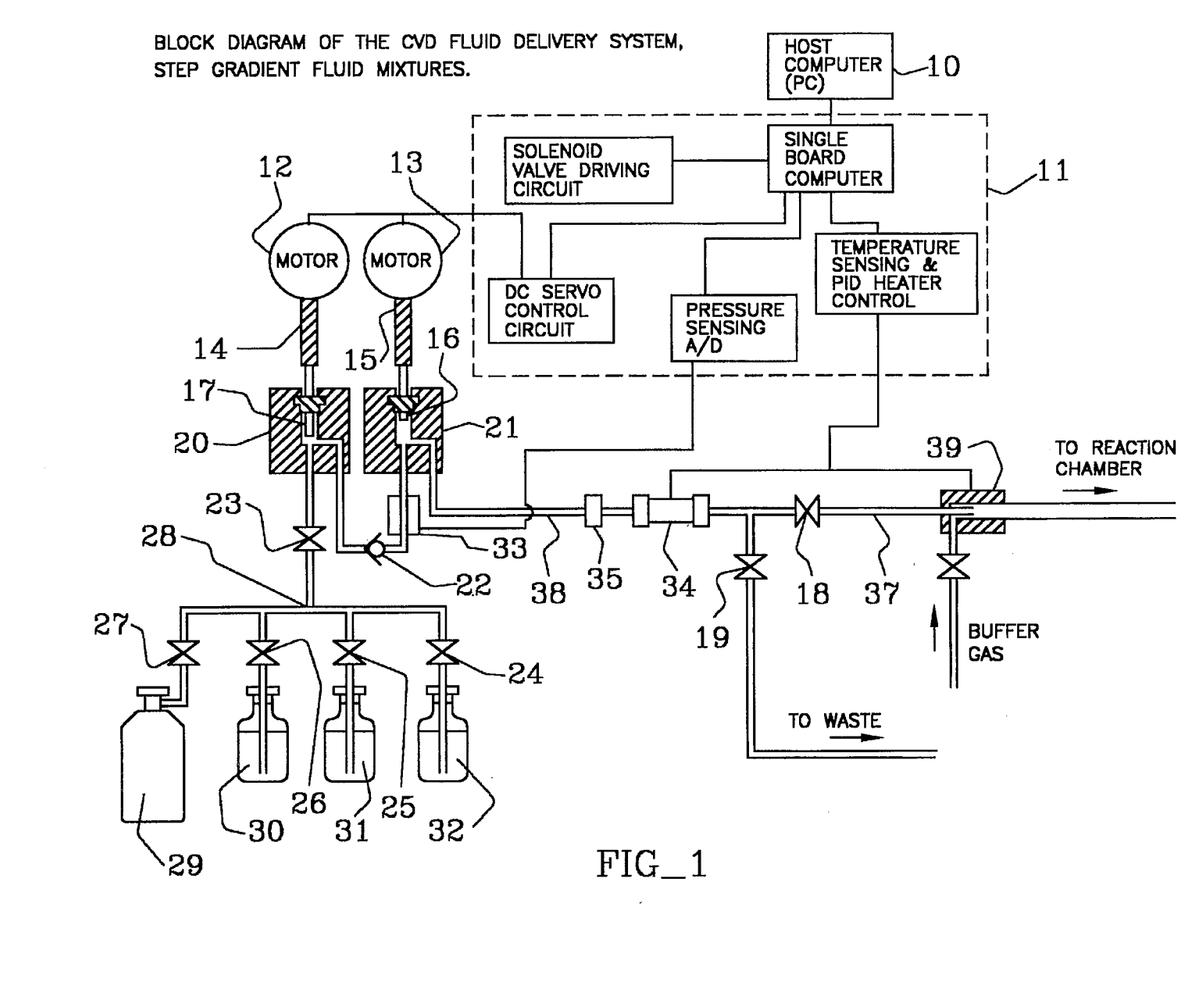
Figure 2:
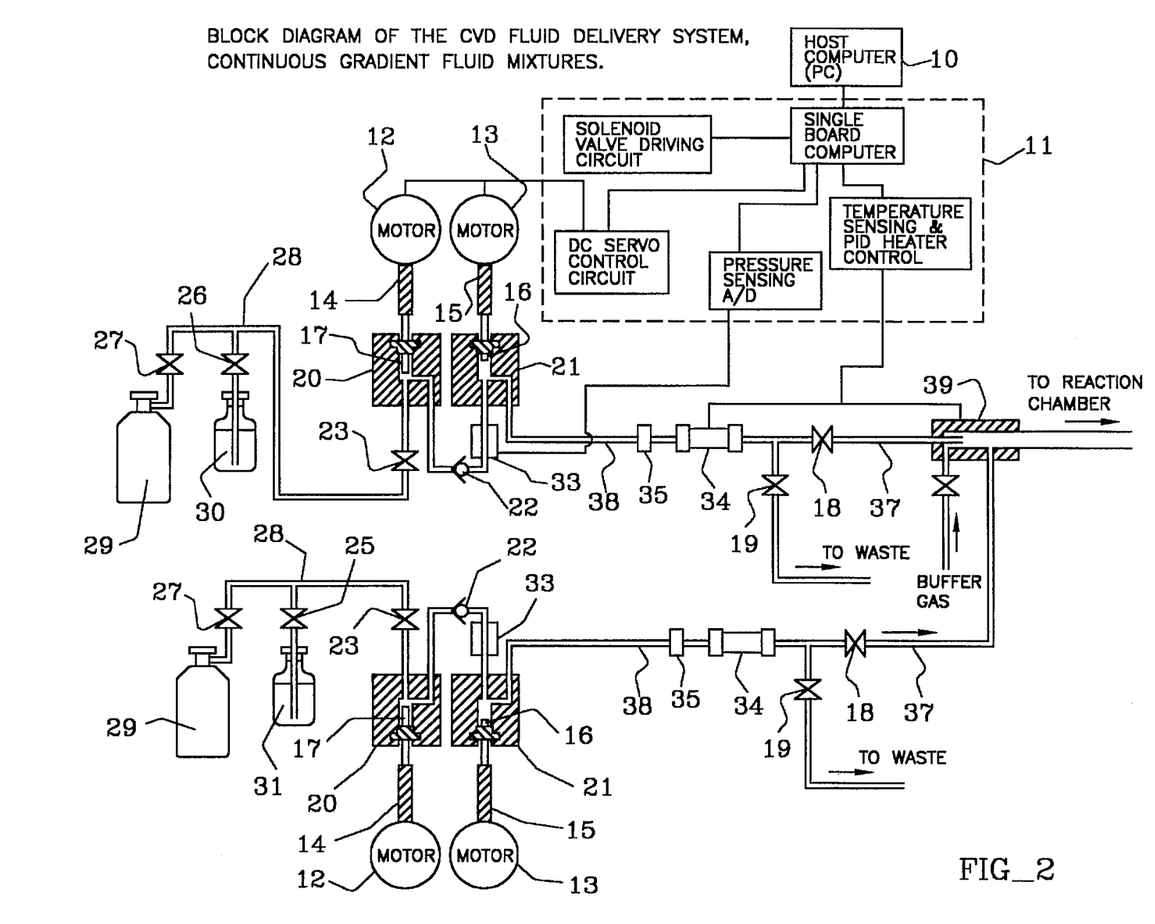
FIG. 2 Block diagram showing the configuration of two independent systems in parallel which constitute the continuous gradient mode of operation. The components depicted are the same as FIG. 1. The diagram depicts the independent attachment of fluid reagents to the system and the parallel joining of the independent vaporizer modules at a common heated gas mixing block.

Preferred Embodiments of the Device are shown by FIGS. 1, 2 and FIG. 5:

FIG. 1 shows the block diagram of the preferred embodiment of the CVD fluid delivery system as configured for the delivery of step gradient fluid mixtures. This configuration is termed the step gradient mode of operation. The typical embodiment has three or more independent containers of reagent (30, 31, 32) used in CVD processes which are pressurized above atmospheric pressure, typically 5–10 PSIG and connected to three independently controlled solenoid switching valves (24, 25, 26). A buffer gas source (29) is connected to an independently controlled solenoid switching valve (27) so as to provide a means of purging reagent from the system. The outlet of said solenoid valves (24, 25, 26, 27) lead to a common inlet manifold (28) that connects to an inlet valve (23). The host computer (10) and servo controller board (11) perform the electronic sensing, analyzing and control functions needed to operate the entire system. The host computer and servo controller board form a complete software and hardware interface to independent servo motors (12, 13) that turn independent ball screws (14, 15). Information from a pressure transducer (33) and optical encoder assemblies on the motor shafts are used to determine the linear velocity of the ball screws.

Upon initialization both a primary plunger (17) and a secondary plunger (16) retract to their predetermined starting positions, and the primary inlet valve (23) and a secondary inlet check valve (22) open to allow a primary liquid chamber (20) and a secondary liquid chamber (21) to completely fill with the reagents from the common inlet manifold (28). A primary shut-off valve (18) leading to a heated gas mixing block (39) opens so that reagent delivery may commence.

For the reagent delivery to commence the secondary drive motor (13) and plunger (16) remain stationary, and the primary drive motor (12) is rotated at a constant angular velocity that is then translated to the constant linear motion of the primary plunger (17) by the primary ball screw assembly (14). This provides a constant volume flow through an outlet tubing that is connected in series to a secondary inlet check valve (22) and the flow pressure transducer (33). The pressure of the system is monitored during this initial delivery stage using said pressure transducer. Said pressure transducer has its outlet in series with the inlet to the secondary liquid chamber (21). When the primary plunger (17) reaches the end of its travel cycle in the primary liquid chamber, the secondary plunger (16) begins its delivery phase.

The reagent delivery from the secondary liquid chamber (21) is performed by the forward motion control of the secondary plunger (16) after the secondary inlet check valve (22) has closed. The motion control of said secondary plunger is performed so that the output pressure will be maintained at the same pressure that was measured during the previous delivery phase. The primary liquid chamber (20) can begin its refill phase by the opening of the primary inlet valve (23) and the withdrawal of the primary plunger (17) during said secondary delivery phase. The primary refill phase continues until the primary plunger (17) has retracted to its starting position, which is followed by the closing of said primary inlet valve (23). After the primary liquid chamber (20) has refilled, the forward motion of the secondary plunger (16) stops. The motion control of the primary plunger (17) then ensues so that the overall pressure of the system remains constant as the secondary liquid chamber (21) then begins its refill phase. After the completion of the secondary chamber's refill phase the control of the primary plunger (17) ceases to be a pressure based control and returns to a constant volume delivery mode that is characterized by the constant linear velocity of the primary ball screw assembly (14) and a complete new pumping cycle for the system can begin again.

The outlet of the secondary liquid chamber (21) is connected in series with a particle filter (35) using a restrictive tubing (38). The particle filter is directly inline with a compliant liquid reservoir (34). The temperature of the liquid reservoir (34) is a closed loop that is controlled using an RTD temperature measurement device and a commercially available electrical heater or cooler. The liquid reservoir (34) is the capacity volume element needed in the RCR coupling scheme, and it also functions as a preheating stage for the reagent before it is delivered. The exit of the liquid reservoir (34) is in series with solenoid valve (18) and an auxiliary purge valve (19) that leads to a disposal apparatus. The solenoid valve (18) then connects to a restrictive capillary tube (37) of selected length. The diameter and length of said capillary tubing (37) creates a resistance to flow that determines the minimal flow rate of the system under vacuum operation.

The heated liquid reservoir (34) both serves to heat the reagent to a temperature that is set from the host computer (10). The reagent within said reservoir is typically heated above its vaporization temperature with respect to the outlet pressure of the tubing (40) leading to the reaction chamber. The reagent liquid stream entering the heated gas mixing block (39) will instantly vaporize due to the superheated conditions of the reservoir (34). The heated gas mixing block (39) allows for the mixing of the reagent gas stream with a buffer or other reagent gas and can provide additional energy to assist with the enthalpy of vaporization associated with the said reagent entering it.

FIG. 2 shows the block diagram of the preferred embodiment of the CVD fluid delivery system as configured for the delivery of continuous gradient fluid mixtures. This configuration is termed the continuous gradient mode of operation. This embodiment is a parallel configuration of the elements of FIG. 1 and identically functioning parts have the same part number. Two independent containers of reagent (30, 31) used in said CVD processes are pressurized above atmospheric pressure, typically around 5–10 PSIG and connected to two independently controlled solenoid switching valves (23). These valves then lead to separate independent pumping channels and their primary liquid chambers (20).

The host computer (10) and servo controller board (11) previously described perform the electronic sensing, analyzing and control functions needed to operate the entire system. The host computer and servo controller board in conjunction with the optical encoder assemblies on the motor shafts and the flow through pressure transducer (33) in the system all form a complete software hardware interface that operates the drive motors (12, 13).

Upon initialization both of the primary plungers (17) and secondary plungers (16) retract to their predetermined starting positions, and the primary inlet valves (23) and the secondary inlet check valves (22) open and allow the primary liquid chambers (20) and the secondary liquid chambers (21) to completely fill with the reagents from their respective sources (30, 31). The primary shut-off valve (18) for the system then opens so that reagent delivery can commence.

For the separate reagent deliveries to commence the plungers (16) of the secondary liquid chambers (21) remain stationary, and the primary motors (12) rotate at independently programmed angular velocities. This provides constant volume flow from each channel of the primary liquid chambers through an outlet tubing leading to the secondary inlet check valves (22). The outlet of said check valves are in series with the flow through pressure transducers (33) which are then connected in series to the inlets of the secondary liquid chambers (21). The outlets of the secondary liquid chambers (21) are then connected through a restrictive tubing (38) in series to a particle filter (35) with a typical mesh of 0.5 micron. The particle filter (35) is directly inline to the capacity fluid reservoir (34) that is temperature controlled. The pressure of the system is monitored during this initial delivery stage using said pressure transducer. The volume reservoir (34) serves as a preheating stage and a capacity element for the system as described.

The exit of the capacity volume reservoir (34) is in series with a restrictive capillary tube (37) that then determines the physical time constant properties of the system as related to its pulsing behavior. The heated gas mixing block (39), and auxiliary purge valve (19) are as previously described. The primary and secondary refill and delivery phases are the same as that described for FIG. 1 except their exist two dual independent systems to perform monitoring and calculations for.

The embodiment described by FIG. 2 allows the flow rate of each specific reagent (30, 31) to be controlled independently. This embodiment is well suited for processes where very small precise amounts of one reagent need to be delivered with respect to large amounts of another reagent. By selecting different sizes for the liquid chambers (20, 21) and plungers (16, 17) the said objective can be easily met.

Figure 3:
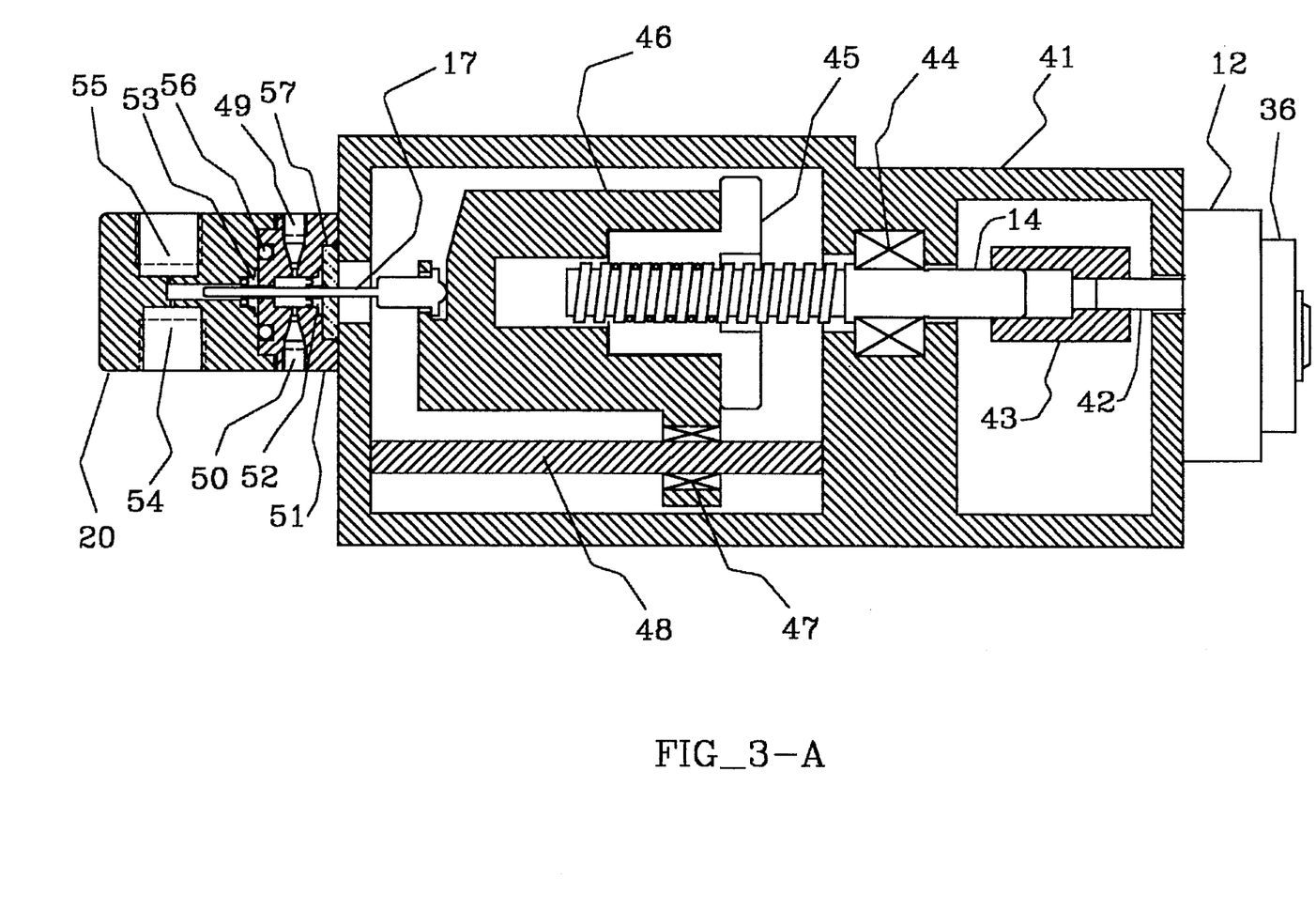
FIG. 3A Diagram shows a cut-away view of the motor shaft, ball screw spindle, translation carriage, plunger-carriage coupling, delivery plunger, secondary plunger seal, washing chamber, inlet and outlet ports of washing chamber, primary plunger seal, reagent delivery chamber, and inlet and outlet ports of the reagent delivery chamber. This diagram depicts only the primary fluid chamber and does not show the secondary fluid chamber or its associated check valves.
FIG. 3B Enlarged diagram of FIG. 3A showing the components from FIG. 3A and in addition the plunger sleeve assembly, washing chamber mantle, plunger sleeve bracket.

FIG. 3A describes in detail the actual motor drive carriage assembly. A servo motor (12) with an attached optical encoder (36) is secured to a mounting frame (41). A motor shaft (42) attaches to the ball screw spindle (14) via a commercially available, flexible drive shaft coupler (43). The ball screw spindle passes through the mounting frame (41) and is held in the plane of motion through its contact with a ball bearing assembly (44) which is fitted into the mounting frame (41). The ball screw spindle (14) passes through a ball screw nut (45). The ball screw nut (45) is mounted to the carriage (46) which translates linearly when the ball screw spindle (14) is rotated. The counter rotation force is balanced by a linear ball bearing (47) which moves along a counter shaft (48) as the carriage translates. The plunger (17) is seen resting in the carriage (46). The linear motion of the carriage provides the force needed to translate the plunger within the liquid chamber. The pump head assembly is connected to the mounting frame (41).

FIG. 3B is an enlargement of FIG. 3A and shows the, plunger (17), carriage (46), mounting frame (41), solvent inlet (49), washing chamber (51), solvent outlet (50) for said washing chamber, O-ring (56), secondary seal (52) that forms the barrier between the washing chamber solvent and the environment, the primary seal (53) that forms the barrier between the primary reagent within the liquid delivery chamber and the solvent within the washing chamber, the liquid delivery chamber (20) containing the reagent or mixture to be delivered, the reagent inlet port (54), the reagent outlet port (55).

The exposed end of the plunger (17) is coupled to the linear motion of the carriage (46). As the carriage translates the plunger translates with it either entering or retracting from the fluid chamber (20). The plunger is constructed of a polished single crystal Sapphire to avoid wear, breakage and oxidation. The plunger (17) moves through a washing chamber assembly formed by the primary seal (53) of the liquid chamber and the secondary seal (52) of the washing chamber (51). The O-ring (56) seals the mounting surfaces between the washing chamber (51) and the liquid chamber (20). In this way the backside of the primary seal is only exposed to the solvent that is contained in the washing chamber. The solvent for the washing chamber (51) enters the inlet port (49) and passes into the washing chamber. The solvent from the washing chamber exits through the outlet port (52).

Figure 4:
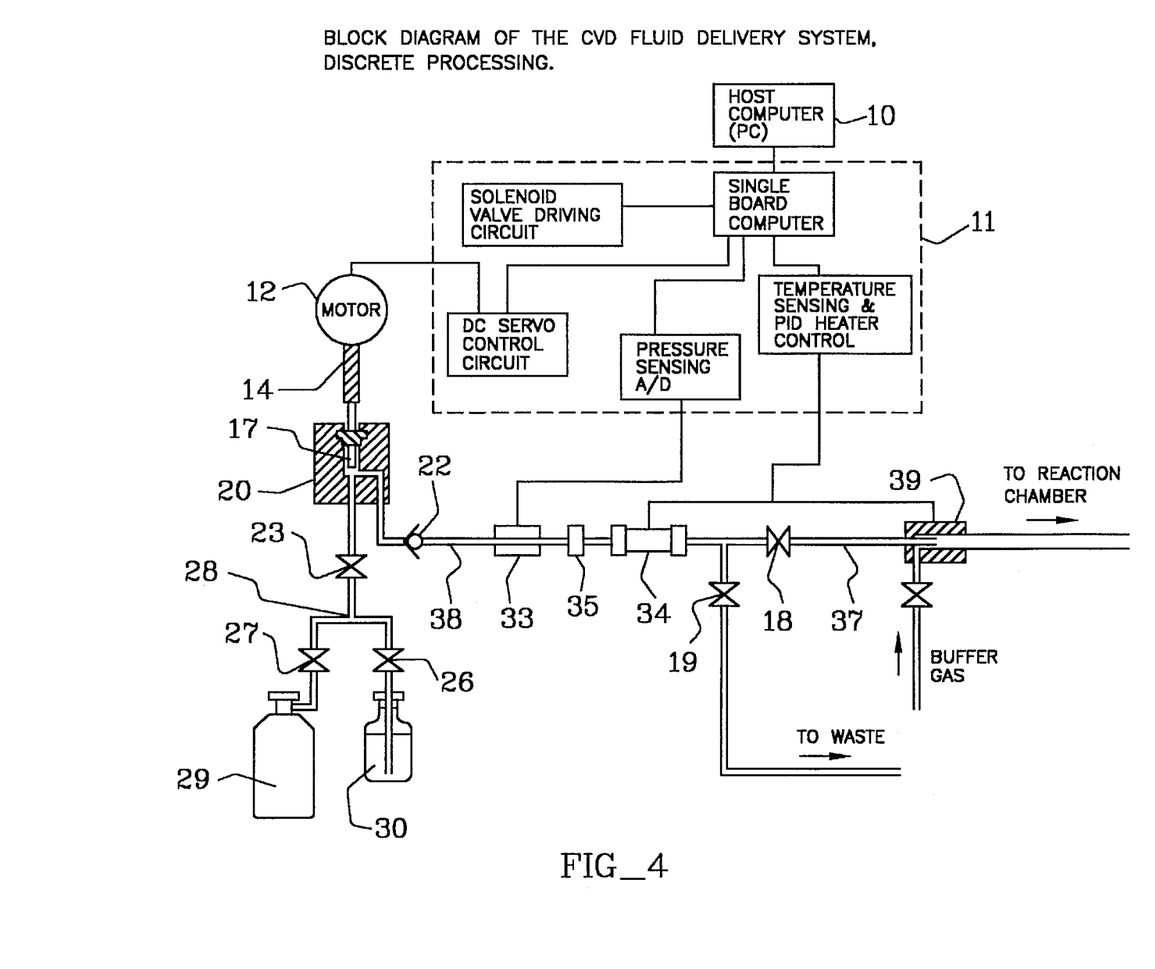
FIG. 4 Diagram shows a block diagram of the system as configured for discrete processes using a single reagent. The diagram depicts the same components as FIG. 1 except for the capacity volume element and the secondary liquid chamber and its associated drive components.

FIG. 4 shows a block diagram of the embodiment of the system as configured for discrete processing. In this configuration the host computer (10) is slaved to an external command. The initialization of the system occurs by the opening of the inlet valves (23, 26) and the opening of the shut-off valve (18). The plunger (17) is then withdrawn into the liquid chamber (20) causing the outlet check valve (22) to close and the liquid chamber to be filled with the reagent (30). After the external command is recognized the host computer (10) initiates the delivery phase by moving the plunger (17) forward into the liquid chamber. During the delivery phase the inlet valve (23) is closed and the reagent flow exits the liquid chamber (20) through the outlet check valve (22). The outlet check valve is then connected in series using connecting tubing (38) to the pressure transducer (33) and particle filter (35). A temperature controlled volume reservoir (34) is then connected in series, but serves no pulse dampening function as it does in the previously described embodiments of FIG. 1 and FIG. 2. The outlet of the volume reservoir (34) then leads through a shut-off valve (18) and exits through connecting tubing (37) to a heated gas mixing block (39). The vaporizing properties of the system remain the same as said descriptions of FIGS. 1 and 2 and are determined by the temperature of the volume element (34) and the temperature of the mixing block (39). The auxiliary valve (19) remains as an outlet for the disposal of reagent from the system.

The incorporation of new regarding positive displacement pumping systems used in the dispensing of chemical reagents for the semiconductor industry allows for the creation of a novel and unique chemical reagent delivery system with hereto now unobtainable characteristics. No positive pumping delivery system has been designed for this industry that can provide a continuous pulse-free operation for the dispensing of chemical reagents as well as also having the means of vaporizing these reagents as they exit the pumping system. Since the temperatures and pressures of the chemical reagents within the delivery system are controlled it is possible to accomplish a vaporization or condensation of these chemical components as they directly exit the system, and they don't need to enter a separate temperature controlled phase transition structure. The three embodiments of the system provide for:

1) An economical way of producing the continuous delivery of reagent mixtures using just a single dual chamber, and a dual motor system as described by FIG. 1 utilizing an independently controlled solenoid inlet valve connected to the individual reagents.

2) A precise way of producing the continuous delivery of precise reagent mixtures as described by FIG. 2, utilizing a multiple configuration of dual chamber, and dual motor systems connected in parallel, so that an independently precisely controlled reagent mixture can be generated at a common outlet of the system. This embodiment is ideally suited to chemical vapor deposition applications where it is necessary to incorporate precise levels of dopant into the matrix film being deposited. Such an example is a matrix film of silicon dioxide formed by a primary silicon reagent such as TetraethylOrthosilicate (TEOS) and phosphorous and boron dopant molecules supplied by such reagents as TriMethyl Phosphite (TMPi) and TriMethyl Borite (TMB)

3) An economical way to produce a non-continuous flow of a reagent or mixture using just a single chamber and motor as described by FIG. 4.

The novel and unique implementation of what we have described as "RCR" coupling has been found to produce an extremely effective device for the control and elimination of discontinuities in fluid flow resulting from the refill of the separate fluid chambers. This is an important feature that allows this system to actually be useful in semiconductor reagent dispensing applications for reasons previously mentioned, but primarily related to the ability of the system to deliver continuously in a pulse-free manner and not have to perform rapid refills as do single chamber systems.

We also have described a means whereby we take advantage of the closed loop motion, temperature and pressure control features of the system so as to not only deliver fluids at precise volumetric rates but also to provide those fluids in a known physical state (gas, liquid) at the exit of the delivery system.

The scope of the invention is not only limited to semiconductor reaction processes but can also apply such fields as supercritical fluid delivery where precise control of temperature and pressure and volumetric flow rates is important.

We claim:

1. A step gradient positive displacement dual plunger system for continuous and pulse-free delivery of reagents for semiconductor processing, said system comprising:

a plurality of reagent sources;

a buffer gas source;

a primary liquid delivery chamber and a secondary liquid delivery chamber;
  wherein said primary and secondary liquid chamber are comprised of a high pressure chamber with an inlet and an outlet, a plunger connected to a motor assembly, fluoropolymer high pressure seals, and a washing chamber;

said motor assembly comprising a ball screw spindle, a counter rotating shaft and bearing, a direct or gear drive motor with an attached optical encoder that provides closed loop motion control;

said plurality of reagent sources and said buffer gas source are connected by solenoid valves to a manifold, said manifold is connected to the inlet of said primary liquid delivery chamber via a solenoid valve;

a pressure transducer is connected to the outlet of said primary liquid delivery chamber via a check valve, and the inlet of said secondary liquid delivery chamber;

a device to minimize the pressure pulsation associated with the plunger operation;
  wherein said device comprise a capillary tube before and in series with a volume element, said volume element is connected in series to another capillary tube, and a heating or cooling means for heating or cooling the reagents in the volume elements;

a heating gas mixing block comprising a reagent inlet, a buffer gas inlet, a heating means for heating the heating gas mixing block, and an outlet to a reaction chamber;
  wherein said reagent is flashed vaporized and mixed with a buffer gas; and the outlet of said secondary liquid delivery chamber is connected before and in series with said device via said capillary tubing, said device is connected before and in series with the reagent inlet of said heating gas mixing block via said capillary tubing.

2. The system as claimed in claim 1, wherein said capillary tubing is manufactured of a material compatible to said reagent.

3. The system as claimed in claim 2, wherein said capillary tubing is formed of fused silica, stainless steel, polymer or titanium tubing.

4. The system as claimed in claim 1, wherein said volume element is manufactured of a material compatible to said reagent.

5. The system as claimed in claim 4, wherein said volume element is formed of stainless steel, polymer or titanium tubing.

6. A continuous gradient positive displacement dual plunger system for continuous and pulse-free delivery of reagents for semiconductor processing, said system comprising;

a plurality of reagent supply means for supplying a liquid reagent to a heating gas mixing block;

wherein said reagent supply means comprises:

a reagent source;

a buffer gas source;

a primary liquid delivery chamber and secondary liquid delivery chambers;

wherein said primary and secondary liquid delivery chambers are comprised of a high pressure chamber with an inlet and an outlet, a plunger connected to a motor assembly, fluoropolymer high pressure seals, and a washing chamber;

said motor assembly comprising a ball screw spindle, a counter rotating shaft and bearing, a direct or gear drive motor with an attached optical encoder that provides closed loop motion control;

said reagent source and said buffer gas source are connected by solenoid valves to a manifold, said manifold is connected to the inlet of said primary liquid delivery chamber via a solenoid valve;

a pressure transducer is connected to the outlet of said primary liquid delivery chamber via a check valve, and the inlet of said secondary liquid delivery chamber;

a device to minimize the pressure pulsation associated with the plunger operation;

wherein said device comprises a capillary tube before and in series with a volume element, said volume element is connected in series to another capillary tube, and a heating or cooling means for heating or cooling the reagents in the volume element;

the outlet of said secondary liquid delivery chamber is connected before and in series with said device via said capillary tubing, said device is connected before and in series with the reagent inlet of said heating gas mixing block via said capillary tubing; and a heating gas mixing block comprising a plurality of reagent inlets, a buffer gas inlet, a heating means for heating the heating gas mixing block, and an outlet to a reaction chamber;

wherein said reagents are flashed vaporized and mixed with a buffer gas.

* * * * *